United States Patent [19] [11] 4,315,065
Pigeon et al. [45] Feb. 9, 1982

[54] OLEOPHILIC, FILM-FORMING PHOTOPOLYMERIZABLE DIAZO AND EPOXY RESIN COMPOSITIONS AND LITHOGRAPHIC PLATES PREPARED THEREFROM

[75] Inventors: Marcel Pigeon; Marta Szretter, both of Neuilly; Chantal Perie, Paris, all of France

[73] Assignee: Rhone-Poulenc Systemes, Cedex, France

[21] Appl. No.: 140,847

[22] Filed: Apr. 16, 1980

[30] Foreign Application Priority Data

Feb. 11, 1980 [FR] France .................... 80 02966

[51] Int. Cl.$^3$ .................. G03C 1/54; G03C 1/60; G03F 7/08
[52] U.S. Cl. .................... 430/175; 430/157; 430/176; 430/280; 430/302; 430/163
[58] Field of Search ............ 430/175, 176, 280, 302, 430/157, 163

[56] References Cited

U.S. PATENT DOCUMENTS

| | | | |
|---|---|---|---|
| 3,205,157 | 9/1965 | Licari et al. | 430/280 X |
| 3,295,974 | 1/1967 | Erdmann | 430/280 X |
| 3,396,019 | 8/1968 | Uhlig | 430/176 |
| 3,660,097 | 5/1972 | Mainthia | 430/175 |
| 3,708,296 | 1/1973 | Schlesinger | 430/176 |
| 3,790,385 | 2/1974 | Steppan et al. | 430/176 |
| 3,794,576 | 2/1974 | Watt | 430/280 X |
| 3,930,856 | 1/1976 | de Moira et al. | 430/176 |
| 4,092,170 | 5/1978 | Houtermans et al. | 430/175 X |
| 4,218,531 | 8/1980 | Carlson | 430/280 X |

Primary Examiner—Charles L. Bowers
Attorney, Agent, or Firm—Sherman & Shalloway

[57] ABSTRACT

A film-forming oleophilic photopolymerizable composition is formed from a fluid epoxy resin having an epoxy equivalent of less than 350 and a photosensitive condensation product of a paradiazodiphenylamine fluoroborate and an organic condensation agent. The photopolymerizable compositions can be used as the photosensitive layer of negative lithographic plates, such as printing plates.

Acidic aqueous solvent-developable negative lithographic plates are also provided in which the photosensitive layer is formed from a layer of the film-forming oleophilic photopolymerizable composition which is deposited on a hydrophilic support from an organic solvent solution.

The lithographic printing plates of the present invention have high mechanical resistance, long shelf-life and can be used in large production runs to make a great number of copies.

14 Claims, No Drawings

OLEOPHILIC, FILM-FORMING PHOTOPOLYMERIZABLE DIAZO AND EPOXY RESIN COMPOSITIONS AND LITHOGRAPHIC PLATES PREPARED THEREFROM

BACKGROUND OF THE INVENTION (1) Field of the Invention

The present invention relates to film-forming, oleophilic photopolymerizable compositions, to the use of such compositions in formation of pre-sensitized photosensitive articles and to negative-working lithographic printing plates so formed. More particularly, the present invention relates to negative-working photopolymerizable, film-forming, oleophilic compositions which are soluble in organic solvents and which are based on specific epoxy resins and specific photosensitive diazo compounds as cross-linking agents for the epoxy resins and to presensitized photosensitive articles, especially negative-working lithographic plates, developable with acidified water using a layer of the film-forming oleophilic photopolymerizable compositions as the photosensitive layer.

(2) Discussion of the Prior Art

The lithographic printing technique for which the compositions of this invention are most particularly intended, is based on the principal of non-miscibility of greasy inks and water and by the formation on a suitable support of hydrophilic, oleophobic zones (i.e. retaining water and rejecting greasy ink) and hydrophobic, inkophilic zones (i.e. retaining greasy ink and rejecting water). After wetting the support with water, the greasy ink is applied to the entire surface and is held at the inkophilic zones but is rejected by the wet hydrophilic zones.

Therefore, lithographic printing plates are formed by coating a photosensitive layer on a suitable support. The photosensitive layers that are used in lithography are generally of two types:

positive working layer in which the zones unexposed to light are kept as image zones after development; and negative working layer in which the unexposed zones are eliminated by development and the exposed zones form a hard printing pattern.

The present invention is particularly concerned with negative working photosensitive compositions and the photosensitive articles and lithographic plates using such negative working photosensitive compositions coated on an underlying support which in the case of lithography is a hydrophilic support. In the case of the negative working lithographic plates, the plate is exposed to ultraviolet light through a negative having transparent zones and opaque zones. The photosensitive composition is polymerized and hardened in zones corresponding to the transparent zones of the negative. The unexposed zones, which correspond to the opaque zones of the negative, are then removed by a developer which does not attack the exposed zones thereby baring the underlying hydrophilic support. The exposed zones are the "image" zones which receive the greasy ink, while the unexposed zones are the "non-image" zones.

At present, most lithographic plates currently used in printing are of presensitized type, i.e., coated with a photosensitive layer and ready to be exposed through an original (generally a transparent support partially covered with opaque zones) to be reproduced.

It is apparent that for negative working lithographic plates, especially printing plates in which the developed plate will be subjected to mechanical stresses and which are typically used for making large numbers of copies, often exceeding 50,000 or even 100,000 copies, it is essential to use photopolymerizable resins which have exceptional hardness and exceptional tenacity. It is known that epoxy resins are particularly well suited to this purpose.

It is known from U.S. Pat. No. 3,205,157 that some diazonium salts such as aryl diazonium fluoroborates mixed with epoxy resins are able, under the action of light, to release a Lewis acid that catalyzes the polymerization reaction of the epoxy resin with itself. For this purpose, the best results are obtained by using 1 to 10 parts of diazonium salt per 100 parts of epoxy resin. However, these mixtures can be used only to make printed circuits and, in a general way, for protective varnishes, but they are not used in the field of lithographic plates. Actually, as is explained in U.S. Pat. No. 3,708,296, these photosensitive compositions, after polymerization, have only a slight receptivity to greasy inks, this property obviously being critical in the graphic arts field. Further, these compositions have other drawbacks such as a very short life due to the chemical instability of the diazonium salts used.

U.S. Pat. No. 3,930,856 also teaches that the presence of an amino group in the diazonium salt should be avoided if it is desired to catalyze the polmerization of the epoxy resins because the freed Lewis acid tends to combine with this amino group and no hardening of the epoxy resin is then noted.

French Pat. No. 2,011,413, to which U.S. Pat. No. 4,093,465 corresponds, describes negative photosensitive compositions which are soluble in organic solvents and which are formed as a mixture of a photosensitive and photohardenable product made up of a photosensitive, water-soluble condensation product of a diazonium compound and an organic condensation agent which is reacted with an organic coupling agent which makes this product insoluble in water, and an oleophilic, film-forming resin soluble in organic solvents. Among the photosensitive diazonium compounds disclosed in these patents are the diazo aromatic compounds and especially p-diazo-diphenyl-amine and its derivatives, condensed with organic condensation agents having reactive carbonyl groups such as aldehydes and acetals and particularly formaldehyde and paraformaldehyde.

The synthetic resins to be mixed with these products are described to include substantially any of the resins which are known to be film-forming, oleophilic and insoluble in water. By way of non-limiting examples the references mention epoxy, phenolic, acrylic, polyamide, polystyrene, polyvinyl chloride, polyvinyl acetate, polyester, polyurethane resins.

It is further described in this French and corresponding U.S. Pat. that the photopolymerizable compositions can be used for making lithographic plates which are developable with aqueous or substantially aqueous solutions.

It is known to be a great advantage to users of lithographic plates that the plates be as simple as possible to use, and therefore development with aqueous solutions for this purpose is highly desirable.

However, at the present time, negative working plates which are developable with water and which have a very long life have not been made practically available on a commercial scale.

U.S. Pat. No. 3,396,019 describes presensitized plates having a support of aluminum treated with a phosphonic acid or one of its derivatives, which is coated with a layer of oleophilic resin which is insoluble in water and a water-soluble condensation product of a diazonium compound, such as paradiazodiphenylamine condensed with formaldehyde in an acid medium. This reference also mentions epoxy resins among the resins that are suitable for making lithograhic plates. However, the plates described in this patent have numerous drawbacks. First, the photopolymerizable composition as described in the embodiments of this patent is very difficult to make in practice. Second, the medium in which the mixture of the oleophilic resin and water-soluble condensation product is prepared is a partially aqueous medium since the diazonium compound used is soluble only in an aqueous medium. Since epoxy resins have a very poor affinity for water it is difficult to use the epoxy resins in such systems.

Furthermore, in making the compositions as described in this patent, it has been found that the compositions precipitate very easily from the acid medium. Still further, these compositions are not film-forming and during coating in thin layers on a support, it has been found that separation of the constituents of the composition occurs, with the diazonium compound separating from the resin. Accordingly, these compositions are not industrially acceptable.

It is also known from U.S. Pat. No. 3,794,576 that monomer or prepolymer epoxy resins, which are fluid at ambient temperature, can be polymerized with from about 0.1 to 5 weight percent of certain diazonium salts such as hexafluorophosphates, tetrafluoroborates, tetrachloroferrates, hexachlorostannates, hexafluoro arsenates, hexafluoroantimonates, etc. which decompose to provide a Lewis acid upon exposure to energy. These compositions can be used to make images with the unexposed portions being removed with suitable solvents.

SUMMARY OF THE INVENTION

Accordingly, it is an object of the present invention to provide a film-forming, oleophilic photopolymerizable composition which is soluble in organic solvents and is suitable for use as the photosensitive layer of negative-working lithographic plates, especially lithographic printing plates, but also generally as a coating, for decoration of substrates and graphic arts due to their capability of forming mechanically strong and chemically resistant surfaces.

It is also an object of the present invention to provide a negative working lithographic plate formed from a hydrophilic support and a photosensitive layer of a photopolymerizerable composition with an epoxy resin base and a paradiazodiphenylamine fluoroborate which is developable with aqueous solutions.

It is still a further object of the present invention to provide a photopolymerizable composition and presensitized photosensitive article which is simple to prepare and simple to use and which has high mechanical strength and which has a very long life.

A further object of the present invention is to provide such a photopolymerizable composition and photosensitive article, especially a negative working lithographic plate which has a long shelf life in addition to a long working life.

These and other objects of the present invention are accomplished by a film-forming, oleophilic photopolymerizable composition which is formed from (1) an epoxy resin forming monomer or prepolymer which is fluid at ambient temperature and which has an epoxy equivalent of less than about 350; and (2) a photosensitive condensation product of (i) a paradiazodiphenylamine fluoroborate and (ii) an organic condensation agent. Photosensitive articles are prepared by depositing a layer of the photopolymerizable composition on a supporting substrate. When the photosensitive layer is imagewise exposed to ultraviolet light, the exposed zones are polymerized and hardened while the unexposed zones are easily removable by development with acidic aqueous solutions.

Quite unexpectedly, it has now been found, in accordance with the present invention, that by using photopolymerizable compositions containing photosensitive products which are the condensation product of paradiazodiphenylamine fluoroborate and an epoxy resin which is fluid at ambient temperature (the fluidity of the resin being enhanced in the absence of solvent) as the photosensitive layer on a suitable hydrophilic support in a negative working lithographic plate, the zones exposed to actinic light polymerize and are hardened while the unexposed zones can be removed by simple rinsing with an aqueous developing solution. Therefore, a lithographic plate coated with a layer of the photopolymerizable composition of this invention can be exposed, developed and dried in just a few minutes.

The present invention will now be described in greater detail in connection with the following description and accompanying examples.

DETAILED DESCRIPTION OF THE INVENTION AND PREFERRED EMBODIMENTS

The photopolymerizable compositions according to the invention are made up of from about 30% to about 70% by weight of paradiazodiphenylamine fluoroborate condensed with a reactive carbonyl group containing organic condensation agent and from about 70% to about 30% by weight of a monomer or prepolymer epoxy resin which is fluid at ambient temperature and which has an epoxy equivalent of less than about 350. These compositions are film-forming, oleophilic and soluble in organic solvents. When they are coated on a support, they are not adhesive, not sticky after evaporation of the coating solvents despite the presence of the liquid epoxy resin. Further, they become extremely hard and wear-resistant after exposure to ultraviolet rays.

Preferably, the photopolymerizable compositions according to this invention will contain nearly equal proportions in the range of from about 40% to about 60%, preferably about 45% to 55%, and most preferably about 50% by weight of each of the two constituents mentioned above. Best results are obtained when the proportion of the two constituents are within these preferred ranges.

When the compositions contain less than 30% by weight of the diazonium salt, the corresponding layers become sticky and the supports coated with these layers become unusable: the photosensitive layer tends to adhere to the negative which is then permanently damaged, while the developed zones of the plate tend to become hazy or foggy. Futhermore, the plates cannot be stored because protective papers with which they are covered adhere to the surface. On the other hand, when the compositions contain more than 70% of the diazonium salt, the hardness of the exposed zone is insufficient and it becomes impossible to make layers which can be developed easily or accurately. Further, after some months of storage, the development becomes long, incomplete and difficult causing a loss of quality of the plate. In amounts within the range of from about 40% to 60% of each of the epoxy resin and diazonium salt the results obtained in lithography are particularly good.

One essential component of the film-forming, oleophilic photopolymerizable compositions of this invention is an epoxy resin forming monomer or pre-polymer which is fluid at ambient temperatures and which has an epoxy equivalent of less than about 350. As used in the present specification and appended claims the term "ambient temperature" refers to the atmospheric temperature of the working environment and typically will be a temperature of at least about 15° C. and more typically refer to a temperature in the range of from about 18° C. to about 30° C.

The fluidic nature of the epoxy resins used in the compositions of this invention can be defined in the same manner as in the above-mentioned U.S. Pat. No. 3,794,576, the disclosure of which is incorporated herein by reference. A specific method that can be used to define the fluidity limit of the epoxy resins useable in this invention, is, for example, the Durran method. According to this method the melting point of the epoxy resin is considered to be that temperature at which the molten resin reaches the summit of the mercury. This method is described in detail in "Analytic Chemistry of Polymers" Part I, pp. 155–156 edited by Goldon M. Kline, Interscience Publishers, Inc., New York.

In the present invention, according to the Durran measuring method, it is preferred that the fluid epoxy resins have a Durran melting point of about 38° C. or less, preferably about 27° C. or less and most preferably about 20° C. or less. The lower limit of the melting point measured by the Durran method is not particularly critical except that it is preferred, in general, to use fluid epoxy resins having a viscosity of at least about 5000 centipoises.

Epoxy resins having Durran melting points greater than 38° C. are too highly viscous to form uniformly smooth thin coating layers. On the other hand with fluid epoxy resins having a viscosity of less than about 5000 centipoises, it becomes difficult in certain cases to obtain a photopolymerizable layer which, after deposit on a support, is not sticky. This is also disadvantageous for obvious reasons including the difficulty in obtaining smooth layers as well as the risk of picking up dirt, etc.

In general, within the above noted limits, as the Durran melting point decreases the stability of the photosensitive composition and the lithographic plate coated with a layer of the photopolymerizable composition, increases. Thus, for epoxy resins having a Durran melting point below about 38° C. and above about 27° development with an acidified aqueous solution with a wetting agent is possible only for a few days after coating to achieve the greatest clarity or sharpness in the reproduced images. For epoxy resins having a Durran melting point in the range of from about 20° C. to about 27° C. development of the exposed photopolymerizable composition with an aqueous solution of acid and wetting agent is possible for about ten days while still being able to obtain the greatest sharpness and clarity of reproduced lines from the original transparency.

With fluid epoxy resins having Durran melting points of about 20° C. or less photosensitive compositions and lithographic plates are obtained having a shelf life of several weeks and even several months or more and are still developable with the aqueous solution after these extended storage periods. This is of course highly desirable in the case of presensitized lithographic plates such as lithographic plates.

The epoxy resins can be used alone or in mixtures to adjust their viscosity to fall within the limits described above. It is possible, for example, and it is advantageous in some cases, to use an epoxy resin with a viscosity less than 5000 centipoises in mixture with an epoxy resin with a higher viscosity to thereby obtain a mixture that can be developed with water for several months or even years. It is also possible, for example, to use a mixture of epoxy resins which include at least one resin with a viscosity less than about 5000 centipoises and at least one resin having a Durran melting point above 20° C. and still obtain photopolymerizable compositions which can be coated on a suitable support which can be exposed and developed with a developer to obtain faithful reproductions even after storage for several months or more. It is thus apparent that it will be possible for a man of ordinary skill in this art following the above teachings to develop all sorts of mixtures of epoxy resins depending on the desired purpose of the photopolymerizable composition. Again, reference is made to the discussion in U.S. Pat. No. 3,794,576 for more detailed discussion on the characteristics and mode of preparation of fluid epoxy resins.

It is another requirement of the epoxy resins of this invention that they have an epoxy equivalent of less than about 350. In the present application the epoxy equivalent of an epoxy resin is understood to be that weight, in grams, of the resin, that contains a gram-equivalent of epoxy groups. For epoxy resins having epoxy equivalents of more than about 350 the hardness and tenacity of the developed plates is insufficient. Preferably the epoxy resins have an epoxy equivalent less than or equal to about 200 since, to obtain the optimum degree of hardness, of the developed plate, it is preferred to have the greatest possible number of epoxy groups throughout the printing plate.

For a further detailed description of epoxy resins one can refer to pages 312–329 of the first supplement volume of "Encyclopedia of Chemical Technology" edited by Kirk and Othmer and published by Interscience Encyclopedia, Inc., New York, 1957 and pages 340–528 of the text "Epoxy Verbindungen Und Epoxyharz" edited by Paquin, published by Springler-Verlag, Berlin, Gottingen Und Heilderberg, 1958.

In general, suitable fluid epoxy resins for use in the compositions and lithographic plates of the present invention include glycidyl ethers of bisphenol A, novolac phenol or cresol epoxy resins, and the like. The diglycidyl ethers of bisphenol A are especially preferred. By way of non-limiting example, mention can be made of the following fluid epoxy resins which are currently available on the market and which are especially suitable for use in the present invention:

ARALDITE grades GY 255, GY 260, EPN 1138 and EPN 1139, trademark products sold by CIBA GEIGY LTD.;

EPON or EPIKOTE, grade nos. 827, 828, 834, etc., trademark products of the Shell Chemical Company.

The second essential component of the film-forming, oleophilic photopolymerizable compositions of this invention is a photosensitive condensation product. The diazonium compound is condensed with an organic condensation agent having reactive carbonyl groups, particularly an aldehyde or acetal. Formaldehyde and paraformaldehyde are especially preferred organic condensation agents. These photosensitive condensation products can be prepared, for example, by the procedure described in British Pat. No. 418,011, the disclosure of which is incorporated herein by reference.

Generally speaking, the reaction between the diazo compound and organic condensation agent is carried out in an aqueous medium in the presence of an acid condensing agent and at room temperature or while cooling. The acid condensing agent, may for example, be hydrochloric acid or sulfuric acid, or any of the other well known acid condensing catalysts. The amounts of the reactants and the time of the reaction are selected so that the resulting condensation product is soluble in organic solvents. Paradiazodiphenylamine fluoroborate condensed with formaldehyde is currently available commercially; by way of non-limiting example, the products sold under the tradenames ZAL $BF_4$ (of the ABM Chemicals Company) and P.1001 $BF_4$ (of the Andrews Paper Company) can be mentioned.

The photopolymeriable compositions of the invention are prepared by combining the epoxy resin and the photosensitive reaction product, generally from organic solutions of each component. Alternatively, the epoxy resin and photosensitive reaction product can be combined in the dry state by simple mixing.

The photopolymerizable compositions according to the invention are generally applied to a support from an organic solvent solution of one or more organic solvents.

To make it possible for the operator to see the parts of the photosensitive layer that have been exposed or simply for decorative purposes, there can be incorporated in the photopolymerizable composition according to the invention one or more colored indicators which are colored in an acid medium. Preferably, so as not to hinder the development of the latent image, it is preferable to limit the weight of the dye to at most 10% of the weight of the photopolymerizable composition. In a general way, an amount less than 5% by weight is perfectly suitable.

To obtain an easy development with the aqueous developing solution, it is advisable not to deposit too thick a layer of photopolymerizable composition according to the invention. It has been found in a general manner that excellent results are obtained by depositing 0.5 $g/m^2$ to 2 $g/m^2$ of photopolymerizable layer and preferably 1 $g/m^2$ to 1.5 $g/m^2$, on a dry basis. When too thin a layer of photopolymerizable sensitive layer is deposited, there is obviously the danger, especially when the support exhibits a certain roughness (lithographic plates in particular) of not having a sufficiently homogeneous and constant layer on the entire support. At deposition amounts greater than 2 $g/m^2$ it becomes difficult at times to remove the unexposed layer with the aqueous developing solution. There is also a greater risk that the polymerization and cross-linking of the epoxy resin will be incomplete if too thick a layer is deposited.

The most important application of the photopolymerizable compositions of this invention is as the photosensitive layer of negative-working lithographic plates, preferably presensitized plates.

In this case, a hydrophilic support will be chosen from the supports well known to a man of the art, such as chromium, aluminum, anodized aluminum, stainless steel, tinned steel, polyester whose surface has been made hydrophilic, and the like. The photopolymerizable composition is deposited on the support within the amounts specified above by the techniques well known in this art.

The photopolymerizable compositions according to the invention adhere very well to these hydrophilic supports. In some cases, there can even be seen a penetration of the photosensitive layer in the microporosities of these supports. In some cases, this penetration causes a phenomenon of greasing of the plate, after development, because the layer is difficult to extract from these microporosities. For this reason, it is preferable to subject the hydrophilic support to a surface treatment intended to stop up these surface microporosities while giving excellent hydrophilicity to the support. A suitable surface treatment simply involves coating the support with an aqueous solution containing about 25% by weight of gum arabic. The excess gum is then removed by washing with water such that only an extremely thin film of gum arabic is then kept on the support.

Another suitable surface treatment well known in the art is hot silicating of the support, more particularly used in treatment of supports of aluminum, whether anodized or not. This treatment is described in French Pat. No. 1,051,461, the disclosure of which is incorporated herein by reference. The solution used is generally a 2% sodium silicate solution whose silica to sodium ratio is betwen 3.2 to 1 and 1 to 1. The aluminum is immersed in this solution at a temperature maintained between about 82° C. and 100° C. After rinsing with water to eliminate the excess silicate, a very thin solid layer of silicate remains on the support. Also, a chromed steel support is perfectly hydrophilic after this treatment.

After exposure through a semitransparent negative, the unexposed parts are removed with a developer made up of an aqueous acid solution to which a wetting agent has been added. One of the very interesting characteristics of the plates of the invention is that they can be developed with aqueous solutions and do not require organic solvents that can cause pollution. As the acid component of the developer, phosphoric acid will preferably be used, since it has the advantage of "preparing" the metal, i.e., give it back its hydrophilic properties, in proportion by weight in relation to the total weight of the developer between about 5% and 40% and preferably between about 10% and 30%. Other organic and inorganic acids can also be used provided they do not adversely effect the hydrophilicity of the support. Generally, the pH of the aqueous developing solution should be within the range of from about 0.5 to about 2, preferably from about 1 to about 1.5.

As examples of anionic wetting agents mention can be made of the water-soluble salts, particularly the alkali metal, ammonium and alkylolammonium salts, of organic sulfuric reaction products having in their molecular structure an alkyl group containing from about 8 to about 22 carbon atoms and a sulfonic acid or sulfuric acid ester group. (Included in the term "alkyl" is the alkyl portion of acyl groups.) Examples of this group of synthetic detergents which can be used as the wetting agent are the sodium and potassium alkyl sulfates, especially those obtained by sulfating the higher alcohols ($C_8$–$C_{18}$ carbon atoms) produced by reducing the glycerides of tallow or coconut oil; and sodium and potassium alkyl benzene sulfonates, in which the alkyl group contains from about 9 to about 15 carbon atoms, in straight chain or branched chain configuration, e.g. those of the type described in U.S. Pat. Nos. 2,220,099 and 2,477,383. Especially valuable are linear straight chain alkyl benzene sulfonates in which the average of the alkyl groups is about 12 to 14 carbon atoms, e.g. sodium lauryl sulfate.

Other anionic wetting agents include the sodium alkyl glyceryl ether sulfonates, especially those ethers of higher alcohols derived from tallow and coconut oil; sodium coconut oil fatty acid monoglyceride sulfonates and sulfates; and sodium or potassium salts or alkyl phenol ethylene oxide ether sulfate containing about 1 to 10 units of ethylene oxide per molecule and wherein the alkyl groups contain about 8 to about 12 carbon atoms.

Nonionic synthetic detergents are also useful as the wetting agent. Such nonionic detergent materials can be broadly defined as compounds produced by the condensation of alkylene oxide groups (hydrophilic in nature) with an organic hydrophobic compound, which may be aliphatic or alkyl aromatic in nature. The length of the polyoxyalkylene group which is condensed with any particular hydrophobic group can be readily adjusted to yield compounds having the desired degree of balance between hydrophilic and hydrophobic elements.

For example, a well-known class of nonionic synthetic detergents is made available on the market under the trade name of "Pluronic". These compounds are formed by condensing ethylene oxide with a hydrophobic base formed by the condensation of propylene oxide with propylene glycol. Other suitable nonionic synthetic detergents include the polyethylene oxide condensates of alkyl phenols, e.g., the condensation products of alkyl phenols having an alkyl group containing from about 6 to 12 carbon atoms in either a straight chain or branched chain configuration, with ethylene oxide, the said ethylene oxide being present in amounts equal to 5 to 25 moles of ethylene oxide per mole of alkyl phenol.

The condensation product of aliphatic alcohols having from 8 to 22 carbon atoms, in either straight chain or branched configuration, with ethylene oxide, e.g., a coconut alcohol-ethylene oxide condensate having from 2 to 30 moles of ethylene oxide per mole or coconut alcohol, the coconut alcohol fraction having from 10 to 14 carbon atoms, are also useful nonionic detergents herein.

Semi-polar nonionic wetting agent, including water-soluble amine oxides containing one alkyl moiety of from about 10 to 28 carbon atoms and 2 moieties selected from the group consisting of alkyl groups and hydroxyalkyl groups containing from 1 to about 3 carbon atoms; water-soluble phosphine oxide detergents containing one alkyl moiety of about 10 to 28 carbon atoms and 2 moieties selected from the group consisting of alkyl groups and hydroxyalkyl groups containing from about 1 to 3 carbon atoms; and water-soluble sulfoxide detergents containing one alkyl moiety of from about 10 to 28 carbon atoms and a moiety selected from the group consisting of alkyl and hydroxyalkyl moieties of from 1 to 3 carbon atoms can also be used.

As examples of suitable synthetic cationic wetting agents there may be noted diamines such as those of the type $RNHC_2H_4NH_2$ wherein R is an alkyl group of about 12-22 carbon atoms, such as N-2-aminoethyl stearyl amine and N-2aminoethyl myristyl amine; amide linked amines, such as those of the type $R_1CONHC_2H_4NH_2$ wherein $R_1$ is an alkyl group of about 9–20 carbon atoms, such as N-2aminoethyl stearylamide and N-aminoethyl myristyl amide; and quaternary ammonium compounds wherein typically one of the groups linked to the nitrogen atom is an alkyl group of about 12–18 carbon atoms and the other three groups are alkyl groups containing 1–3 carbon atoms and wherein the anion is hallogen, acetate, methylsulfate, etc., such as ethyl dimethyl stearyl ammonium chloride.

Among the many commercially available products, the following can be mentioned:

AMONYL 250 BA or 380 BA (of the Seppic Company),

SIMULSOL 1030 NP (of the Seppic Company),

MELANOL LP 20 T, CL 30 V 90 or CL 90 (of the Seppic Company),

BACFORD AD or BL 80 (of the Bacford Company),

DEHYDOL 25 (of the Dehydag Company),

SOPROPHOR TPH (of the Soprosoie Company),

P3VR 3153/3 (of the Henkel Company).

The qualities of the developer can be improved by adding to it about 1% by weight of benzyl alcohol.

The photopolymerizable layers according to the invention have the property, after exposure to ultraviolet light, of being extremely hard and resistant to solvents, including dimethylformamide.

The invention will be better understood from the following embodiments, given by way of non-limiting examples:

EXAMPLE 1

On a chromed steel support treated with a gum arabic solution, degummed by rinsing with water, then dried, a coating of the following solution is applied by a whirler (50 rpm) for 30 seconds:

| | |
|---|---|
| Novolac epoxy resin 1139 (CIBA-GEIGY) (epoxy equivalent: 172 to 179, viscosity at 52° C.: 1700 cps, Durran melting point: 18° C.) | 1 g |
| paradiazodiphenylamine fluoroborate condensed with formaldehyde:ZAL BF4 (ABM company) | 1 g |
| methyl red | 0.04 g |
| dimethylformamide | 60 g |
| isopropanol | 19 g |
| primary butanol | 19 g |

The plate thus coated is then dried in the whirler for 5 minutes at 40° C., then in an oven at 85° C. for 5 minutes.

After exposure through a negative for 2 minutes on a 2-KW NU-ARC frame, a visible image is observed due to the presence of methyl red. Then the image is developed by the mechanical action of a pad, for 1 to 1.5 minutes, which has been wetted with an aqueous solution containing 12% by weight of phosphoric acid and 5% by weight of an amphoteric cationic wetting agent of the AMONYL 380 BA type. The unexposed parts of the layer are dissolved.

(The same results are obtained with an aqueous solution containing 20% phosphoric acid and 5% by weight of nonylphenol nonionic wetting agent such as SIMULSOL 1030 NP or with an aqueous solution containing 25% by weight of phosphoric acid and 5% by weight of lauryl sulfate anionic wetting agent of the MELANOL CL 30 or CL 90 type.)

Using as a negative the various screened scales on the market, the following results are obtained:

with the UGRA scale (which represents the various screened areas of offset screens of 60 lines and 120 lines/cm the scale comprising 12 areas reproducing all the points from 4% to 96% of the surface covered), all parts are reproduced, including the finest points of the screen of 120 lines/cm.

with the FOGRA scale (which makes it possible to measure with precision the resolution power of the plate, because it comprises positive and reserve (negative) lines whose thicknesses are measured in microns: 4, 6, 8, 10, etc), the positive lines of 4 microns and negative lines in reserve of 6 microns are perfectly clear. With the plate locked in the press, it was possible to obtain more than 1 million impressions without apparent wear of the layer, which is quite remarkable.

Further, after development, the plate has excellent resistance to organic solvents: no alteration of the images was noted after immersion of the plate for 15 minutes in ethyl alcohol, ethylglycol, methyglycol acetate or dimethylformamide.

EXAMPLE 2

On the same support as in example 1, there is applied a coating of the following solution with a whirler (50 rpm) for 30 seconds:

| | |
|---|---|
| dimethylformamide | 60 g |
| primary butanol | 35 g |
| novolac epoxy resin 1139 (CIBA GEIGY) | 3 g |
| paradiazodiphenylamine fluoroborate condensed with formaldehyde (ZAL BF$_4$ ABM Company) | 22 g |

After drying in the whirler for 5 minutes at 40° C., then in an oven for 5 minutes at 85° C., the plate is exposed through a negative for 2 minutes on a 2-KW NU-ARC frame at a distance of 60 cm from an ultraviolet lamp.

The exposed parts become blue to obtain an image visible in white light and inactinic illumination.

The image is then developed as in example 1 with an aqueous solution containing 12% by weight of phosphoric acid and 5% by weight of amphoteric cationic wetting agent of the AMONYL 380 BA type.

The same results are obtained from the viewpoint of line fineness, resistance to solvents and number of impressions as in example 1.

The same results are also obtained by developing the plate with an aqueous solution containing 20% phosphoric acid and 5% nonylphenol nonionic wetting agent (SEMULSOL 1030 NP) and a development solution containing 25% phosphoric acid and 5% lauryl sulfate anionic wetting agent (MELANOL CL 30 or CL 90).

EXAMPLE 3

Under the same conditions as in example 1, a chromed steel support, treated with polyacrylamide, is coated with the following solution:

| | |
|---|---|
| novolac epoxy resin 1139 (CIBA-GEIGY) | 1.5 g |
| paradiazodiphenylamine fluoroborate condensed with formaldehyde (ZAL BF$_4$ ABM Company) | 2.5 g |
| dimethylformamide | 60 g |
| isopropanol | 18 g |
| primary butanol | 18 g |

The resulting plate is then exposed and developed under the same conditions as in example 1, with the same developers. The same results are obtained from the viewpoint of line fineness, resistance to solvents and number of impressions.

EXAMPLE 4

An identical support is coated with the following solution under the same conditions as in example 1:

| | |
|---|---|
| epoxy resin (ARALDITE GY 260 CIBA-GEIGY) (epoxy equivalent between 185 and 196, viscosity at 25° C. of 12,000 cps to 16,000 cps, Durran melting point of 10° C.) | 3 g |
| paradiazodiphenylamine fluoroborate condensed with formaldehyde (ZAL BF$_4$ of ABM Company) | 2 g |
| dimethylformamide | 45 g |
| methyl acetate | 50 g |

After exposure under the same conditions as in example 1, the resulting plate is developed with an aqueous solution containing 12% phosphoric acid and 5% lauryl sulfate type wetting agent (MELANOL LP 20 T of the Seppic Company). The same results are obtained as in example 1, both from the viewpoint of development quality and resistance to solvents and from the viewpoint of long life of the plate.

The same results are also obtained with a development solution containing 20% phosphoric acid and 5% wetting agent.

EXAMPLE 5

A lithographic plate is made under conditions identical with those of example 4 by replacing the ARALDITE GY 260 resin with the same amount of ARALDITE GY 255 (CIBA-GEIGY) resin (epoxy equivalent between 180 and 200, viscosity at 25° between 5000 and 6000 cps, Durran melting point of 5° C.).

The same results are obtained as in example 1

EXAMPLE 6

A lithographic plate is made under the same conditions as those of example 4 by replacing the ARALDITE GY 260 resin with the same amount of EPIKOTE 828 resin (Shell Chemical Co.) (epoxy equivalent between 184 and 194, viscosity at 25° C. between 10,000 and 15,000 cps and Durran melting point of 10° C.).

The same results are obtained as in example 1.

EXAMPLE 7

A lithographic plate is made under the same conditions as those of example 1. The resulting plate is subjected to an accelerated aging test in an oven at 60° C. for 24 hours. After exposure as in example 1, the plate is developed with the following solution:
  12% by weight of 85% phosphoric acid,
  5% by weight of P3VR3153/3 wetting agent of the Henkel Company,
  83% by weight of demineralized water.

A quality copy is obtained that is quite remarkable from the viewpoint of line fineness.

This application is related to the commonly assigned applications entitled "Water Developable Film-Forming Photopolymerizable Compositions" Ser. No. 134,328 filed Mar. 26, 1980 and "PHOTOSENSITIVE ARTICLE FOR MAKING VISUAL AIDS" Ser. No.

134,326 filed Mar. 26, 1980. Both of these applications describe photopolymerizable compositions using fluidic epoxy resins and photosensitive diazonium compounds. The fluidic epoxy resins are the same as in the present invention. The diazonium compounds differ in that the condensed diazonium compound is reacted with an organic coupling agent which renders the reaction product soluble in organic solvents and only slightly soluble in water. An organic coupling agent is not used in the present invention. The exposed photopolymerizable compositions of these copending applications are developable with water alone, i.e. the unexposed regions can be removed with water only and do not require an acid or wetting agent in the developing solution.

In the present invention, the fluoroboride salt of the condensed diazonium compound is not water soluble, and does require an acidified aqueous developer containing a wetting agent.

What I claim is:

1. An oleophilic, film-forming, organic-solvent soluble photopolymerizable composition, which consists essentially of:
   (a) from about 30% to 70% by weight of a condensation product of paradiazodiphenylamine fluoroborate with a reactive carbonyl group-containing organic condensation agent and;
   (b) from about 70% to 30% by weight of a monomer or prepolymer epoxy resin or mixture thereof, which is fluid at ambient temperature and which has an epoxy equivalent of less than about 350, a Durran melting point of about 38° C. or less and a viscosity of at least about 5,000 cps at 25° C.; said composition being capable, when in coated layer form, of development with an aqueous developing solution containing an acid and a wetting agent.

2. The photopolymerizable composition according to claim 1 which comprises from about 40% to 60% of (a) and from about 60% to 40% of (b).

3. The photopolymerizable composition according to claim 1 which comprises approximately equal amounts of both (a) and (b).

4. The photopolymerizable composition according to claim 1 wherein the organic condensation agent is an aldehyde or an acetal.

5. The photopolymerizable composition according to any one of claims 1, 2 or 3 wherein the organic condensation agent is formaldehyde or paraformaldehyde.

6. The photopolymerizable composition according to claim 1 wherein the epoxy resin has an epoxy equivalent of about 200 or less.

7. The photopolymerizable composition according to claim 1 wherein the epoxy resin has a Durran melting point of about 27° C. or less.

8. The photopolymerizable composition according to claim 1 wherein the epoxy resin has a Durran melting point of about 20° C. or less.

9. The photopolymerizable composition according to claim 1 wherein the epoxy resin is selected from the group consisting of bisphenol A glycidyl ethers, phenol novolacepoxy resins and cresol novolac epoxy resins or mixtures thereof.

10. The photopolymerizable composition according to claim 1 wherein the epoxy resin is a bisphenol A diglycidyl ether.

11. A photosensitive article comprising
    I. a support, and
    II. a photosensitive layer coated on said support, said layer hardening when exposed to actinic light, the unexposed layer being removable with an aqueous developer,
    wherein said photosensitive layer is a layer of the photopolymerizable composition of claim 1.

12. A photosensitive article according to claim 11 wherein the weight of the photosensitive layer deposited on the support is between 0.5 g/m$^2$ and 2 g/m$^2$.

13. A photosensitive article according to claim 11 wherein the weight of the photosensitive layer deposited on the support is between 1 g/m$^2$ and 1.5 g/m$^2$.

14. A photosensitive article according to one of claims 10 to 12 wherein the support is hydrophilic, said material being intended for lithographic printing.

* * * * *